(12) United States Patent
Hasler et al.

(10) Patent No.: US 8,698,892 B2
(45) Date of Patent: Apr. 15, 2014

(54) ONE-DIMENSION POSITION ENCODER

(75) Inventors: David Hasler, Neuchatel (CH); Peter Masa, Onnens (CH); Pascal Heim, Saint-Aubin (CH); Edoardo Franzi, Yverdon-les-Bains (CH)

(73) Assignee: CSEM Centre Suisse d'Electronique et de Microtechnique SA - Recherche et Developpement, Neuchatel (CH)

( * ) Notice: Subject to any disclaimer, the term of this patent is extended or adjusted under 35 U.S.C. 154(b) by 420 days.

(21) Appl. No.: 13/262,663

(22) PCT Filed: Apr. 3, 2009

(86) PCT No.: PCT/EP2009/054021
§ 371 (c)(1),
(2), (4) Date: Oct. 3, 2011

(87) PCT Pub. No.: WO2010/112082
PCT Pub. Date: Oct. 7, 2010

(65) Prior Publication Data
US 2012/0026321 A1    Feb. 2, 2012

(51) Int. Cl.
*H04N 7/18*        (2006.01)
*G01D 5/347*      (2006.01)
*G01D 5/244*      (2006.01)
*G01D 5/249*      (2006.01)

(52) U.S. Cl.
CPC ........ *G01D 5/34746* (2013.01); *G01D 5/24438* (2013.01); *G01D 5/2495* (2013.01); *G01D 5/24452* (2013.01)
USPC ...................... 348/135; 348/137; 348/E7.085

(58) Field of Classification Search
None
See application file for complete search history.

(56) References Cited

U.S. PATENT DOCUMENTS

| 4,914,437 A | 4/1990 | Kibrick et al. |
| 5,235,439 A * | 8/1993 | Stoll ................................. 359/7 |

(Continued)

FOREIGN PATENT DOCUMENTS

| DE | 25 12 283 A1 | 9/1976 |
| DE | 199 19 042 A1 | 11/2000 |
| DE | 10 2004 018404 A1 | 11/2005 |
| EP | 1 477 775 A2 | 11/2004 |

OTHER PUBLICATIONS

International Search Report, dated Mar. 16, 2010, from corresponding PCT application.

(Continued)

*Primary Examiner* — Christopher S Kelley
*Assistant Examiner* — Kaitlin A Retallick
(74) *Attorney, Agent, or Firm* — Young & Thompson

(57) ABSTRACT

A one-dimension position measurement system includes: a first ruler having a first one-dimension binary code $s_i$ applied thereon, a camera for acquiring a picture of a portion of the code $s_i$, the portion having a length of I bits, and some processing elements. Each codeword of length I of the one-dimension code $s_i$ is unique within the whole code $s_i$. A codeword $a_i$ is read from the acquired picture, and the processing elements are implemented for computing an absolute position p of the codeword $a_i$ of the code $s_i$ from: (I). An ad-hoc interpolation method is used to obtain a precision way below the distance between two bits of the codewords. The code $s_i$ may be applied on the ruler by using some geometric primitives, a geometric primitive for encoding a "1" being different from a geometric primitive for encoding a "0", both having the same horizontal projection. The horizontal projection is then used for fine interpolation, achieving nanometer-scale resolution.

24 Claims, 4 Drawing Sheets

(56) References Cited

U.S. PATENT DOCUMENTS

| | | |
|---|---|---|
| 6,528,783 B1 | 3/2003 | Mortara et al. |
| 7,431,219 B2 | 10/2008 | Lapstun |
| 2002/0154306 A1* | 10/2002 | Eisen et al. .................. 356/429 |
| 2003/0016266 A1* | 1/2003 | Urselmann .................... 347/37 |
| 2006/0243895 A1 | 11/2006 | Nordenfelt et al. |
| 2007/0091174 A1* | 4/2007 | Kochi et al. .................. 348/135 |

OTHER PUBLICATIONS

Kari Engelhardt et al., "High-resolution optical position encoder with large mounting toerances", Applied Optics, May 1, 1997, pp. 2912-2916, vol. 36, No. 13.

* cited by examiner

| $n$ bits | window length | distance | period $N$ | $h(x)$ | seed $a_0$ |
|---|---|---|---|---|---|
| 7 | 9 | 2 | 63 | $1 + x^2 + x^4$ | 1000111 |
| 7 | 10 | 2 | 127 | $1 + x + x^2 + x^4$ | 1000111 |
| 7 | 8 | 2 | 62 | $1 + x + x^5$ | 1000111 |
| 7 | 10 | 3 | 62 | $1 + x + x^5$ | 1000111 |
| 7 | 9 | 2 | 105 | $1 + x^2 + x^3 + x^5$ | 1000111 |
| 7 | 11 | 3 | 127 | $1 + x^3 + x^4 + x^5$ | 1000111 |
| 7 | 8 | 2 | 60 | $1 + x + x^2$ | 1011101 |
| 8 | 8 | 2 | 63 | $1 + x$ | 11100110 |
| 8 | 9 | 2 | 127 | $1 + x + x^2$ | 11100110 |
| 8 | 9 | 2 | 93 | $1 + x + x^3$ | 11100110 |
| 8 | 11 | 2 | 255 | $1 + x^2 + x^3 + x^5$ | 11100110 |
| 8 | 11 | 3 | 127 | $1 + x^2 + x^3 + x^4 + x^5$ | 11100110 |
| 8 | 9 | 2 | 62 | $1 + x + x^2 + x^3 + x^6$ | 11100110 |
| 8 | 9 | 2 | 124 | $1 + x + x^2 + x^3 + x^5$ | 00101111 |
| 8 | 8 | 2 | 60 | $1 + x^4 + x^5$ | 01010011 |

…

ONE-DIMENSION POSITION ENCODER

FIELD OF THE INVENTION

The present invention relates generally to the field of one-dimension absolute position encoders, particularly to encoders comprising a reference ruler, and a camera in order to measure the position of the camera with respect to the ruler.

BACKGROUND OF THE INVENTION

Position encoders are well known in the art. They generally consist in building a ruler, on which a code is applied, the ruler being arranged on an object. The code can also be directly applied on the object. By reading and analysing a small portion of the code, it shall be possible to determine the position of the code portion within the entire wide code. Generally, the small portion is acquired by a camera and consequently, the position of the camera with respect to the ruler can be computed.

Such systems can compute a one-dimension position or a two-dimension position. For one-dimension position measurement, it could be an objective to be able to measure a nanoscale position (i.e. with a resolution in the order of the nanometer).

To reach such a resolution, the system generally implements a ruler with two tracks, an absolute track and a regular track, a track being a part of a ruler on which a one-dimension code is applied. The absolute track is used to determine an absolute position, but the resolution of the result is limited to the spacing between two consecutive bits of the code applied on this absolute track. The regular track is used to compute, by interpolation, a precise position well beyond the resolution of the position computed from the absolute track. By combining both absolute and precise position, it is possible to compute unambiguously a precise absolute position of the camera with respect to the ruler. However, such a double-track ruler is quite large, and also requires a system being able to read independently both tracks, i.e. either a camera with a larger field of view or two cameras. It has a direct negative impact on the compactness and the cost of the system. Moreover, to get a good precise absolute position, it is important that the absolute track and the regular track are aligned as perfectly as possible, which can be difficult to ensure when engraving the ruler.

In the article "High-resolution optical position encoder with large mounting tolerances" by K. Engelhardt and P. Seitz in Applied Optics (May 1997), several periods of the regular track are read by a collection of photodiodes achieving a multiplication of the regular track with a sine and cosine signal. The multiplications by the sine and the cosine signals are directly embedded within the photodiodes, and consequently, the regular track is acquired twice, once for sine multiplication and once for cosine multiplication. The period of the sine and cosine signals is hard-coded, being, for precision reasons, as close as possible to the period of the regular signal. The phase information, corresponding to the precise position of the regular track, is then computed from the projected multiplication of the signal by the sine signal and the projected multiplication of the signal by the cosine signal. However, as the sine signal is multiplied with the top part of the regular signal and as the cosine is multiplied with the bottom part of the regular signal, it introduces a distortion if the ruler is slightly tilted, yielding to a loss of precision.

To cope with the tilting problem, the solution disclosed in document U.S. Pat. No. 6,528,783 is to acquire the regular code only once, and performing the multiplication by the sine signal and the cosine signal on the same acquired code. The period of the sine and cosine signals are also hardcoded. The drawback of the disclosed system is that the multiplication and the projection are performed analogically, and is consequently subject to noise and could affect the precision of the measure.

The document US 2006/0243895 discloses a system implementing a ruler with both a regular and an absolute track. A portion of code is read using a one-dimension CCD (Charge-Coupled Device) for each track, and the one-dimension image acquired is directly available on a digital form. The processing is similar to the one described in the above-mentioned article, but is performed digitally. Consequently, it can compensate the positioning imprecisions, and can adapt the frequency of the sine and cosine signals. Nevertheless, the use of only one CCD line per code track misses the opportunity to average out the noise of the CCD pixels and loses some precision.

Moreover, the temperature can considerably affect the precision, since the thermal expansion of the ruler can be well beyond the required nanoscale precision. A thermal compensation is therefore necessary. Document DE 199 19 042 discloses a thermally compensated measurement system. It implements a ruler and two reading heads (such as cameras), the distance between the two cameras being known. The positions of the cameras with respect to the ruler are simultaneously measured, and the distance between the cameras can be computed. The position of one of the camera can be compensated against temperature by using both known and measured distance between the cameras. Such a method has the drawbacks to require two reading heads, and moreover, the distance between both reading heads shall be maximised in order to have a good thermal compensation. These features have a direct impact against the compactness of the system.

The present invention proposes a method such that these drawbacks are avoided.

SUMMARY OF THE INVENTION

The present invention discloses a one-dimension position measurement system comprising:

a first ruler, on which a first one-dimension binary code $s_i$ is applied, a camera for acquiring a picture of a portion of the code $s_i$, the portion having a length of l bits, and some processing means.

Each codeword of length l of the one-dimension code $s_i$ is unique within the whole code $s_i$, and the minimum Hamming distance between any codeword of length l of the code $s_i$. A codeword $a_i$ is read from the acquired picture of the portion of code $s_i$, and the processing means are implemented for computing an absolute position p of the codeword $a_i$ of said code $s_i$ from:

$$p = \operatorname*{argmin}_{k}\left(\sum_{i=0}^{l} |a_i - s_{i+k}|\right).$$

The present invention also discloses a one-dimension position measurement system comprising:

a first ruler, on which is applied a first one-dimension code, a second ruler, on which is applied a second one-dimension code, a camera for acquiring simultaneously a picture of a portion of the first one-dimension code and of a portion of the second one-dimension code, and some processing means.

The second ruler is disposed parallel to the first ruler, one end of the first ruler being tied to one end of the second ruler, the other end of the first and second rulers being free, and the first and second rulers are made of material having different temperature expansion coefficients.

BRIEF DESCRIPTION OF THE DRAWINGS

The above and other objects, features and advantages of the present invention will become further apparent from the following description of the preferred embodiment taken in conjunction with the accompanying drawings, in which.

DETAILED DESCRIPTION

In the following description we will firstly present the construction of suitable one-dimension codes as well as a method for computing the position of a portion of this one-dimension code within the whole code. Secondly, an efficient method for correcting reading errors is proposed, benefiting advantageously from the features of the absolute code. Two preferred embodiments for engraving the absolute code on a ruler are then disclosed, as well as a method for reading efficiently the code on the ruler. Some means for increasing the resolution are then proposed, using advantageously a single track-ruler. A calibration procedure is also presented, improving the precision of the measured position. Finally, two methods are proposed for compensating temperature and sensor tilt negative effects.

In the following description, computation can be performed using any known processing means, such as a microprocessor core, a microcontroller, an application specific integrated circuit (ASIC), a programmable device (such as a FPGA) or a combination of any of these means.

Absolute Code

In this section, a suitable one-dimension code is proposed.

Figures 1, 2:
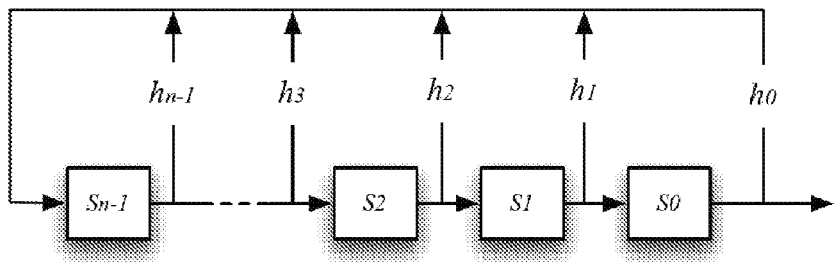
FIG. 1 depicts a linear shift feedback register used to produce an absolute code.
FIG. 2 is a table giving some examples of suitable absolute codes, and their characteristics.

A one-dimension binary code $s_i$ is built using a LFSR (Linear Feedback Shift Register) as depicted in FIG. 1. The code $s_i$ is defined by a seed value $a_0$ and a feedback equation:

$$a_0 = [s_0 s_1 s_2 s_3 \ldots s_{n-1}]$$

$$s_{i+1} = h_{n-1} \cdot s_i + h_n \cdot s_{i-1} + \ldots + h_0 \cdot s_{i-n},$$

where $h_i$ is a binary number. The vector $$h = [h_0 h_1 \ldots h_{n-1}]$$

is a filter that can be represented as a polynomial $$h(x) = h_{n-1} x^{n-1} + \ldots + h_1 x + h_0$$

called the feedback polynomial. The code produced by a LFSR is a pseudo-random code.

For a given LFSR length n, all seed values $a_0$ and feedback polynomials h(x) do not necessarily produce a suitable periodic code. Suitable seed values $a_0$ and feedback polynomials h(x) are obtained by trial and error techniques. For a given LFSR length n, all combinations of seed-value and feedback polynomial are tested. A simulation of the code is performed for each set of seed value $a_0$ and feedback polynomial h(x). If, additionally, the smallest period N of the code produced suits the physical setup where the encoder will be used (i.e. if the period N is long enough so that the code covers an adequate physical length of the ruler), the code is declared valid.

An example of a 9 bits code, with period N=511 is given by $$a_0 = [1\ 0\ 0\ 1\ 1\ 1\ 0\ 0\ 0]$$

$$h(x) = x^6 + x^5 + x^4 + x^3 + x + 1. \tag{1}$$

One of the properties of the whole code, in addition to the fact that it repeats itself every N bits, is that every codeword is unique, a codeword being a portion of consecutive bits of the code, the portion being at least n-bit length.

Consequently, it is possible, by using such codes, to determine, without ambiguity, the position p of any codeword along the whole code. The one-dimension position p is computed as the minimum of the absolute difference between the codeword of n bits a and the whole code $s_i$:

$$p = \operatorname*{argmin}_{k} \left( \sum_{i=0}^{l} |a_i - s_{i+k}| \right). \tag{2}$$

Error Correction

Error correction is a very useful feature for a position encoder, since some speck of dust could lead to misread some bits of the code and consequently miscompute the position.

Error correction is generally performed by adding redundant information, to be able to detect and possibly correct some reading error. Additional bits could be added to some blocks of the code, but, it would be necessary to know, in the observed bits, where the raw bits (from the code) are and where the additional bits are. Practically, it is not possible since the codeword are an arbitrary portion of the whole code. The only solution would be to add to each bit of the absolute code at least one error-correction bit. However, this solution would at least double the number of bits to carry the same information. Additionally, in the decoding process, a fairly large number of bits have to be read in order to be able to decode the message.

One aspect of the present invention is to propose a method that retrieves the position even in the presence of noise or reading errors without doubling the number of bits arranged on the ruler. This is made possible by increasing the number of observed bits of the absolute code described above, and/or using codes with shorter periods. This way the observed data is of course also a codeword, but additionally, the Hamming distance between any two codewords is increased. The Hamming distance is defined as the minimum number of differing bits between any two codewords. When reading a larger codeword where some bits could be misread, the probability to read another valid codeword (i.e. that exists elsewhere in the whole code) is reduced.

When performing trial and error to determine suitable parameters $a_0$ and h(x), as described above, another suitable parameter to determine is the window length l of the observed codeword. The minimal Hamming distance between all codewords shall be computed for each set of parameters, until the required value is obtained.

The FIG. 2 represents a table giving some examples of suitable codes, and their characteristics.

The error correction process consists in reading the bits in the observed window of length l, and computing the Hamming distance between the observed word and all the possible codewords of the same length l of the code. The corrected codeword is obtained by selecting the possible codeword whose Hamming distance with the observed word is the smallest. The position p of the corrected codeword $a_i$ is then computed from the following equation:

$$p = \operatorname*{argmin}_{k}\left(\sum_{i=0}^{l}|a_i - s_{i+k}|\right) \quad (3)$$

If the reading system outputs binary values, a minimal distance of 2 (two) allows a detection of every one-bit error in the observed data. With a minimal distance of 3 (three), every one-bit error can be corrected. With a minimal distance of 4 (four), every one-bit error can be corrected and every two-bit error can be detected.

If the reading system outputs values ranging between 0 and 1 rather than binary values 0 or 1, error correction can be guaranteed on codes whose distance is 2, by using the relation given in equation (3). Statistically, the method proposed in equation (3) can even correct for errors as soon as there exists a codeword in the code whose hamming distance to all the other codewords is larger than 2. This happen when the code read by the camera belongs to codewords with said property. Since the code is read by the camera, it is fairly easy to keep the grayscale values delivered by the camera to generate values from 0 to 1 instead of binary values.

The minimum Hamming distance between any codeword of the whole code shall be selected depending on:
  the number of errors to be detected or corrected, and
  the type of data (binary or not) outputted by the camera.

For example, when observing within a 13-bit window the whole code described by equation (1), the minimal distance (found by trial) is 3 (three). To decode the observed bits, the Hamming distance between the observed data and every 13-bit codewords of the code is computed. The decoded data is the codeword for which the Hamming distance with the observed data code is minimal. If two computed Hamming distances are equals, it means that at least two observed bits are erroneous and the error cannot be corrected.

Engraving the Ruler

Once a suitable absolute code is built, this absolute code shall be applied on the ruler and be readable by a camera. The code is generally applied on the ruler by modifying the surface of the ruler or directly the surface of an object whose position is to be measured. The modifications can concern for example one or more of the following characteristics of the surface of the ruler: the colour, the texture, the depth, the reflexivity, the light reflection orientation . . . . Without limitation, the following description will refer to a black/white printing or engraving.

Figure 3:
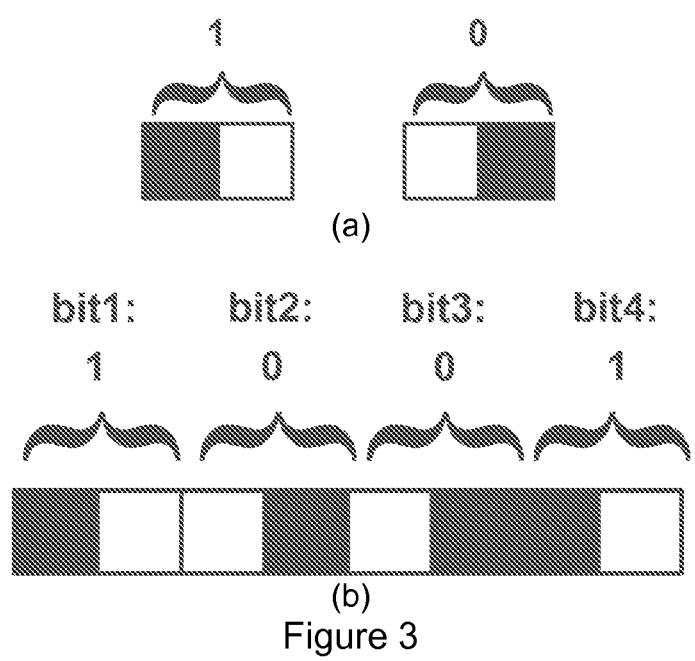
FIG. 3 presents a Manchester encoding of an absolute code such as being obtained by a linear shift register depicted on FIG. 1.

In a first embodiment, referring to FIG. 3, the absolute code is encoded using a Manchester code, one bit of the code consisting in juxtaposing horizontally two different building blocks (black or white in the example), the kind of transition (black-to-white or white-to-black) representing the value of the bit. A transition from white to black is used to encode a "0" and a transition from black to white is used to encode a "1". This coding is very efficient, thanks to his robustness against non-uniform lighting in the fields of view. By measuring local transitions, the code can be decoded even if a black region on the left of the field of view appears brighter than a white region on the right of the field of view.

To read a Manchester code, the system needs to discriminate between transitions within a bit, and transitions between consecutive bits. For example, if a black-to-white transition is detected, it could be due to the presence of a "1", or it could be due to two consecutive "0". However, as soon as a sequence "01" or "10" in the code appears, the indetermination can be solved since in a "01" or "10" sequence there is a lack of black-to-white or white-to-black between the two bits of the sequence, but there is still a transition within each bit of the sequence. If a sequence containing only some "0" is read or if a sequence containing only some "1" is read, the indetermination cannot be solved. Fortunately, thanks to the generation of the code using a LFSR as described above, the code containing only some "1" can appear only once, and the code containing only some "0" never appears. Consequently, if the indetermination to know where transitions between bits are cannot be solved, it means that the sequence read contains only some "1".

Figure 4:
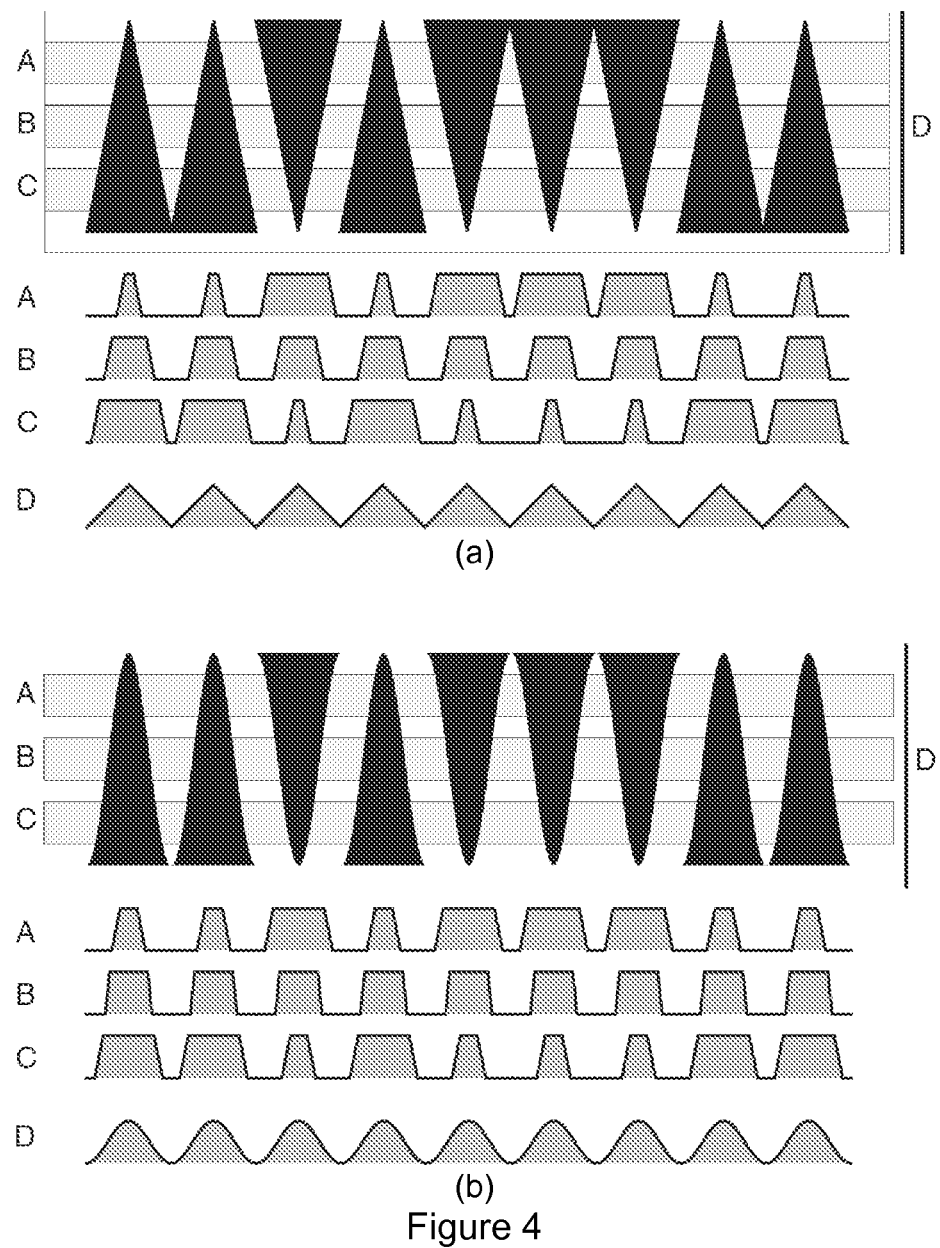
FIG. 4 presents a geometric primitive encoding of an absolute code such as being obtained by a linear shift register depicted on FIG. 1.

In a second embodiment, the absolute code is encoded using geometric primitives, like triangles or sinusoidal shaped primitives as illustrated in FIG. 4. The primitives could be, without limitation, black on a white background.

A "1" is encoded by a primitive obtained by flipping vertically the primitive used to encode a "0", the primitives having no horizontal symmetry. For example a triangle with its tip on the top encodes a 0 and the triangle with its tip on the bottom encodes a 1.

Using the geometric shapes for encoding the code provides also a good robustness against non-uniform lighting. Still referring to FIG. 4, it is possible to read each primitives at location (A) and location (C) and determining, in which location is the primitive largest.

The primitives can also have any shape provided that the "0" are different from the "1", and that the horizontally projected shape is identical for a "1" and a "0", the advantage of this feature being explained hereafter. For example, the horizontal projection of the triangles of FIG. 4(a) are also triangles and does not depend whether the tip of the triangle used as primitive is oriented up or down. The horizontal projection of the geometric shapes is represented in the bottom part of FIGS. 4(a) and 4(b).

Reading the Code

The picture of the camera is composed of a plurality of lines, the lines being juxtaposed vertically. In a general case, a 1D code can be read in a single line of the picture and this principle is applicable to Manchester encoding. To achieve a higher precision, it is however particularly interesting to read several lines of the same code and average or sum them, i.e. to sum together the pixels of each column of the picture of the code. In this way, the quantization resolution is increased by $\log_2(L)$ bits, where L is the number of lines of the code read by the camera. The best results are generally obtained when the code is read using the maximum available height. When there is noise in the image pixels, such reading increases the signal to noise ratio by the same amount than the quantization resolution and allows for better interpolation and better positioning precision.

When using primitive to encode the absolute code, the camera shall read the code in two distinct locations A and C to determine the value of each bit, requiring at least two lines of the camera. It is particularly interesting to read and sum or average the lines read in two distinct areas A and C, providing the same quantization benefits than exposed above. The signals on the bottom part of FIGS. 4(a) and 4(b) represents the horizontal projection of the geometric primitives around their respective areas A, B, C or D.

Increasing the Resolution

The position computed from the absolute code of equation (1) is obtained with a resolution corresponding to the spacing between two consecutive bits of the absolute code. A practical value for this spacing is 0.1 mm. It is not possible to reduce substantially the spacing between two consecutive bits of the code since it would require codes with a much longer period N, having consequently much larger codeword, and would lead to imaging and engraving challenges. To get a nanoscale precision, an interpolation can be performed.

When the ruler is engraved using geometric primitives, an absolute position can be computed, as described above. Additionally and advantageously, a signal $A_k$ is obtained by projecting horizontally the primitives of the code, $A_k$ being represented as the bottom signal of FIGS. 4(a) and 4(b). Thanks to the features of the geometric shapes, the signal $A_k$ is regular, i.e. it repeats itself. Consequently, $A_k$ has the same properties as an additional regular track and is suitable to perform an interpolation, increasing the precision of the computed position.

The interpolation consists in computing the phase of the regular signal $A_k$ with regard to a reference signal.

To perform the interpolation, a picture of the geometric primitives is acquired, the picture being composed classically of pixels. It is important to mention that the acquisition shall substantially oversample the period of the geometric primitives. All the pixels of a column of the picture are summed together, each sum being an element of the signal $A_k$. This operation corresponds to a horizontal projection of the geometric primitives. The bottom signals on FIGS. 4(a) and 4(b) represents the signal $A_k$ corresponding to the reading of regular track of FIG. 4. The top signal on FIG. 5 represents the signal $A_k$ corresponding to the reading of another geometric primitives.

Figure 5:
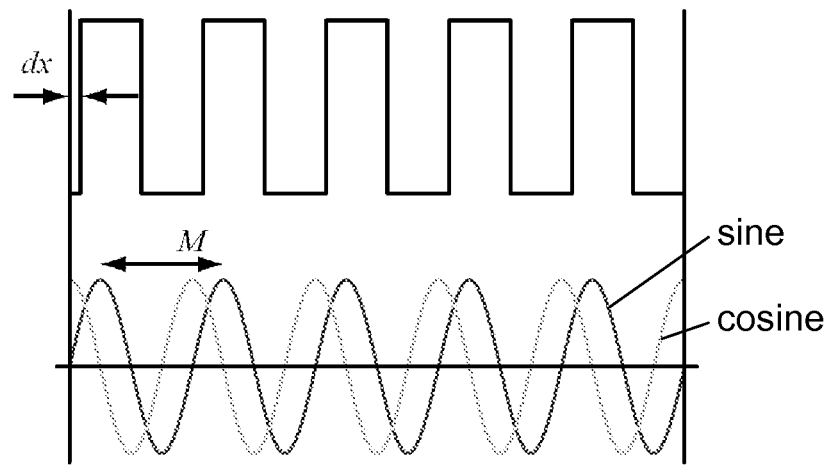
FIG. 5 presents the useful signals to perform a position interpolation from a regular track.

The signal $A_k$ is convolved independently, with a sine and a cosine signal having the same period as $A_k$, the sine and cosine signals being the bottom signals of FIG. 5. The phase $\gamma$ is computed from the following relations:

$$S = \sum_{i=1}^{l \cdot m} A_k(i) \cdot \sin\left(\frac{2\pi(i-1/2)}{m}\right) \quad (4)$$

$$C = \sum_{i=1}^{l \cdot m} A_k(i) \cdot \cos\left(\frac{2\pi(i-1/2)}{m}\right)$$

$$\gamma = -a\tan2(S, C)$$

where l is the number of periods of $A_k$ in the field of view of the camera and m is the period of $A_k$, expressed in number of pixels of the picture. It is important that the multiplication is performed over a range equal to a multiple of the period of the sine and cosine signals.

An absolute precise position P of the camera with respect to the ruler is then computed by adding the absolute position p computed from equation (3) with the precise position dx, computed from the following relation:

$$dx = M \cdot \gamma / 2\pi.$$

$$P = M \cdot p + dx. \quad (5)$$

where M is the period of the regular code expressed in mm.

Once dx is computed, the system knows precisely where the bits of corresponding to the geometric primitives are in the acquired picture. This information can advantageously be used to properly align the reading grid (i.e. where the system expects to read the geometric primitives) exactly on the bits corresponding to the geometric shapes. It increases the signal to noise ratio by avoiding that reading a bit is influenced by the pixels of a neighboring bit.

Consequently, and unlike classical techniques, an interpolation can be performed even on a single track ruler, allowing for both precise and compact position encoders. Moreover, this solution solves the alignment issue between an absolute track and a regular track.

A Manchester encoded ruler is also suitable for a single-track interpolation, but requiring an adaptation of the method, by segmenting the sine and cosine signals in groups of half period length.

The phase $\gamma$ is computed from the following relations:

$$S = \sum_{j=0}^{l-1} W_j \sum_{i=1}^{m/2} A_k(i + j*m/2) \cdot \sin\left(\frac{2\pi(i+1/2)}{m} + j \cdot \pi\right) \quad (6)$$

$$C = \sum_{j=0}^{l-1} W_j \sum_{i=1}^{m/2} A_k(i + j*m/2) \cdot \cos\left(\frac{2\pi(i+1/2)}{m} + j \cdot \pi\right)$$

$$\gamma = -a\tan2(S, C)$$

The main difference with double track interpolation is that a function $W_j$ is introduced. The method to compute the precise position of a Manchester-encoded ruler comprises the following steps:

- project horizontally the picture acquired by the camera to produce the signal $A_k$,
- detect black-to-white and white-to-black transitions in $A_k$ and read the absolute code using any known method,
- compute the value of $W_j$,
- set the last non-zero $W_j$ to 0 if necessary,
- compute the precise position dx using equation (6) and equation (5),
- re-read the absolute code using the precise position dx to align the reading grid, and
- correct the phase for Manchester encoding.

The signal $A_k$ is produced from the horizontal projection of the image acquired by the camera, using the same method than for the geometric primitive encoded ruler.

The algorithm then detects the locations of the transition from white-to-black (wb) or black-to-white (bw). These transitions occur at positions separated by m/2 pixels, where m is the width of a bit of the Manchester code, being expressed in pixels. Any known method can be used for this purpose. In the following paragraph, we consider samples of the signal $A_k$ separated by m/2 pixels (it is recalled that a white or a black building block in the code has a width of ½ bit of the code, i.e. m/2 pixels, a building block being one single element of a bit, two different building blocks being necessary to encode one bit). The absolute code is read by detecting the presence or absence of bw or wb transitions on the signal $A_k$.

Let T be a measurement of the upcoming transition, and $p_j$ the location of the $j^{th}$ building block of the code, i.e. the location of $A_k(j*m/2)$:

$$T_j = \begin{cases} 1 & \text{if there is a } bw \text{ transition between } p_j \text{ and } p_{j+1}; \\ -1 & \text{if there is a } wb \text{ transition between } p_j \text{ and } p_{j+1}; \\ 0 & \text{if there are no transitions between } p_j \text{ and } p_{j+1}. \end{cases}$$

Since the black or white building blocks have a width of m/2, there can be at most one transition between a position j and a position j+1. By comparing the transition signal T to the sign of the sine signal, we define the value $W_j$ as $$W_j = \begin{cases} T_j, & \text{if } j \text{ is even}; \\ -T_j, & \text{if } j \text{ is odd}. \end{cases} \quad (6)$$

In addition, the number of transitions should be even, i.e. $\Sigma_j W_j=0$. If this is not the case, the last non-zero $W_j$ has to be set to 0.

Figure 6:
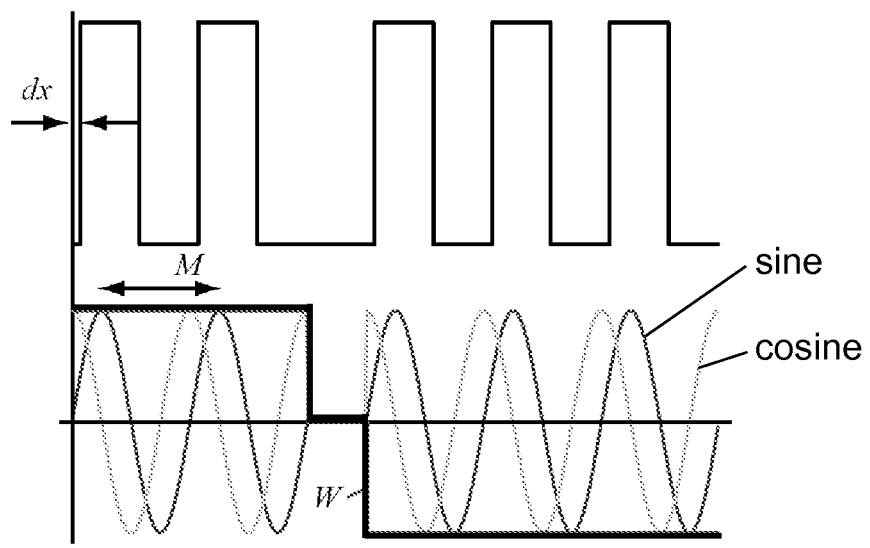
FIG. 6 depicts the useful signals to perform a position interpolation from a single Manchester encoded track.

FIG. 6 depicts on the top the signal $A_k$ and on the bottom, the signal W and its multiplication by the sine and cosine signals. The signals $A_k$ corresponds to a sequence (b)[w b w b bw b w b w], where b is a black region and w is a white region, corresponding to a code (0)[0 0 1 1 1] according to Manchester encoding, the first (0) being the code immediately to the left of the computation window.

Since the first transition is a bw transition, j=0, thus $W_0$=1. The second transition is wb, j=1, thus $T_1$=−1 and $W_1$=1. By following this reasoning, and making sure that there is an even number of transitions, the signal $W_j$ can be computed and used to multiply the sine and cosine signal to get dx. The value of $W_j$ is plotted in FIG. 6.

The precise position dx may have to be corrected in the following cases.

If the observed absolute code is not a Manchester code, it means that the observed window is not aligned with the transition between bits, but rather with the transitions within bits. In that case, the precise position dx shall be corrected by M/2, and the absolute code reinterpreted using the corrected precise position dx to align the reading grid.

If the observed absolute code is a code with only "0", it means also that the observed window is not aligned with the transition between bits, but rather with the transitions within bits (since that, as mentioned above, a code with all "0" is not possible when using a LFSR to generate the whole absolute code). In that case, the precise position dx shall be corrected by M/2, and the absolute code reinterpreted using the corrected precise position dx to align the reading grid.

With a transparent ruler having a single track, and by using shadow imaging to project the code of the ruler on the camera without using a lens, the encoder can be very compact and cost-effective.

A mean to increase more the resolution is to use an optical magnification system, placed between the ruler and the camera. Such a system allows reading the regular code with a higher resolution, and increases the resolution of the computed position accordingly. For example, by using a 20× optics, a resolution in the order of 10 nanometers was obtained.

Calibrating the System

The resolution obtained by interpolation tends to exceed the precision of the imprinting or engraving of the ruler. To achieve a precision in the order of the resolution, a calibration procedure is performed for each position measurement device. The calibration procedure consist in coupling the present device (called the device under calibration) to a more precise position measurement device in a controlled temperature and humidity environment, and to measure the output $\hat{x}$ of the device under calibration and the output x of the precise device for a plurality of positions. For each device under calibration, a look-up table $x=f(\hat{x})$ is built.

When using a calibrated device, a position $\hat{x}$ is measured. The value $\hat{x}_i$ is searched for in the look-up table, such as $\hat{x}_i < \hat{x} < \hat{x}_{i+1}$. The look-up table is read to retrieve the values $x_i$ and $x_{i+1}$. The corrected position x is then computed by interpolating between $x_i$ and $x_{i+1}$ using known techniques, a linear interpolation being particularly suitable.

Temperature Compensation

As mentioned above, thermal compensation is necessary when designing nanoscale position encoders.

The thermal compensation, according to the present invention, consists in combining two rulers a and b, each one having different temperature expansion coefficient $\alpha_a$ and $\alpha_b$. $\alpha$ is expressed in $°C.^{-1}$. One end of ruler a is tied to one end of ruler b, the other end of each ruler being free, so that each ruler expands independently when the temperature increases. The rulers are oriented in the same direction from their tied ends. A single camera is used to measure simultaneously its position with respect to each ruler, by acquiring a portion of the code on each ruler. A single picture of both rulers is acquired, this picture being then divided horizontally into two parts, one half-picture for each ruler.

Each ruler can advantageously consist in a single-track ruler disclosed above, and the position can be advantageously computed from each half-picture using one of the solutions described above.

The position measured on ruler a is $x_a$ and the position measured on ruler b is $x_b$.

The system is calibrated at a reference temperature T, by measuring the position of $x_b$ when $x_a$=0. This procedure can be incremental, by moving the camera with respect to the rulers, measuring the position $x_a$ on the ruler a and doing it again until $x_a$=0.

The position measured at this step on ruler b is $x_{b0}$:

$$x_b = x_{b0} |_{x_a=0}.$$

To compute a temperature independent position x, the system uses the two measurements $\{x_a, x_b\}$ such as:

$$\begin{cases} x_B - x = \alpha_b \cdot \Delta T \cdot x \\ x_a - x = \alpha_a \cdot \Delta T \cdot x \\ x_B = x_b - x_{b0} \end{cases}$$

where $\Delta T$ is the temperature drift (i.e. the difference between the temperature of the rulers during $x_a$ and $x_b$ measurements and the reference temperature T), and where x is the temperature-independent position. Consequently, the temperature-independent position x is given by:

$$x = \frac{\alpha_b x_a - \alpha_a x_B}{\alpha_b - \alpha_a}.$$

It is important that the temperature expansion coefficients differ as much as possible to get the best possible temperature stability. In addition, there should be a good thermal coupling between the two rulers in order to ensure the same local temperature of both rulers. Finally, the friction between the two rulers should be minimized, in order to avoid a jerky relative motion when the temperature changes. If the temperature is likely to be non-uniform, the thermal conductivity of the material of the rulers is also an important feature.

Among materials with low thermal expansion coefficient, we can mention Quartz, Silicon, Borosilicate glass and Fe—Ni36%. Among materials with a high thermal expansion coefficient, we can mention PVC, Lead, Brass, Aluminum, and Copper.

For example a ruler made of Fe—Ni36% combined with a ruler made of Brass is a good choice for this application. Steel can also be used with either Fe—Ni36% or Brass, because it has a medium thermal expansion coefficient. Nevertheless, the stability of the compensation will not be as good.

Sensor Tilt Compensation

The comparison of two position measurements taken on two rulers with a single camera, as for thermal compensation, is sensitive to the tilt of the camera (i.e. the tilt angle θ between the horizontal axis of the ruler of the code and the horizontal axis of the image acquired by the camera). In that case, the difference between the measured positions $x_a$ and $x_b$ is not due only to the different thermal expansion of the rulers, but also to the tilt of the camera.

When using a Manchester-encoded ruler, it is possible to remove the influence of the tilt by dividing horizontally again the acquired image of one of the rulers into a top part and a bottom part, the height of each part being equal to h. Two positions of the ruler are then computed independently using the disclosed method, one for the top part and one for the bottom part. The difference Δx between the two computed positions is due to the tilt angle θ of the camera, θ being calculated from:

$$\theta = \arctan(\Delta x/h)$$

Knowing the value of the tilting angle θ, its influence can easily be removed using simple trigonometry.

The preceding description is provided as non-limiting examples and one skilled in the art will not encounter any particular difficulties in implementing some variations of embodiment without going outside the scope of the present invention.

For example, the system and the method were described to measure a one-dimension linear position. The system can also implement a circular ruler, whose centre is coaxial with the rotation axis of an object, in order to measure an angular position.

Additionally, the system can also be used to measure speed or acceleration, by computing and integrating respectively once and twice the position measured according to the method disclosed.

The invention claimed is:

1. A one-dimension position measurement system comprising:
    a first ruler, on which a first one-dimension binary code $s_i$ is applied along the length of said first ruler,
    a camera for acquiring a picture of a portion of said code $s_i$, said picture being composed of a plurality of lines arranged to be parallel to the ruler, and said portion having a length of l bits, and
    a processing means,
wherein each codeword of length l of the one-dimension code $s_i$ is unique within the whole code $s_i$, and wherein said processing means are implemented for summing some lines of said picture normally to the ruler, and wherein a codeword $a_i$ is read from said summed lines of said acquired picture, and wherein said processing means are implemented for computing an absolute position p of said codeword $a_i$ of said code $s_i$ from:

$$p = \underset{k}{\operatorname{argmin}}\left(\sum_{i=0}^{l}|a_i - s_{i+k}|\right).$$

2. The one-dimension position measurement system of claim 1, wherein the minimum Hamming distance between any codeword of length l of said code $s_i$, is at least 2.

3. The one-dimension position measurement system of claim 1, wherein the output of said camera are binary data, and wherein the minimum Hamming distance between any codeword of length l is at least 3, and wherein said codeword $a_i$ is, among all possible codewords of length l of said code $s_i$, the codeword whose Hamming distance with the code extracted from said acquired image is minimum.

4. The one-dimension position measurement system of claim 2, wherein the output of said camera are binary data, and wherein the minimum Hamming distance between any codeword of length l is at least 3, and wherein said codeword $a_i$ is, among all possible codewords of length l of said code $s_i$, the codeword whose Hamming distance with the code extracted from said acquired image is minimum.

5. The one-dimension position measurement system of claim 1, wherein said code $s_i$ applied on said first ruler uses some geometric primitives, a geometric primitive for encoding a "1" being different from a geometric primitive for encoding a "0", and a horizontal projection of said primitive for encoding a "1" being identical to a n horizontal projection of said primitive for encoding a "0".

6. The one-dimension position measurement system of claim 2, wherein said code $s_i$ applied on said first ruler uses some geometric primitives, a geometric primitive for encoding a "1" being different from a geometric primitive for encoding a "0", and a horizontal projection of said primitive for encoding a "1" being identical to a horizontal projection of said primitive for encoding a "0".

7. The one-dimension position measurement system of claim 3, wherein said code $s_i$ applied on said first ruler uses some geometric primitives, a geometric primitive for encoding a "1" being different from a geometric primitive for encoding a "0", and a horizontal projection of said primitive for encoding a "1" being identical to a horizontal projection of said primitive for encoding a "0".

8. The one-dimension position measurement system of claim 4, wherein said code $s_i$ applied on said first ruler uses some geometric primitives, a geometric primitive for encoding a "1" being different from a geometric primitive for encoding a "0", and a horizontal projection of said primitive for encoding a "1" being identical to a horizontal projection of said primitive for encoding a "0".

9. The one-dimension position measurement system according to claim 5, wherein said geometric primitives have a triangular shape.

10. The one-dimension position measurement system according to claim 5, wherein said geometric primitives have a sinusoidal-portion shape.

11. The one-dimension position measurement system according to claim 5, wherein the processing means are implemented for analysing and compare the acquired picture in at least two distinct areas in order to read each bit of the codeword $a_i$.

12. The one-dimension position measurement system according to claim 5, wherein said processing means are implemented for computing a precise position P of said camera with respect to said first ruler by combining the absolute position p and a precise position dx, said precise position dx being calculated from:

$$dx = M \cdot \gamma / 2\pi.$$
$$P = M \cdot p + dx.$$

and $$S = \sum_{i=1}^{l \cdot m} A_k(i) \cdot \sin\left(\frac{2\pi(i - 1/2)}{m}\right)$$

$$C = \sum_{i=1}^{l \cdot m} A_k(i) \cdot \cos\left(\frac{2\pi(i - 1/2)}{m}\right)$$

$$\gamma = -a\tan2(S, C)$$

where $A_k$ is the horizontal projection of said acquired picture, m is the period of $A_k$ expressed in number of pixels of said acquired picture, and M is the period of $A_k$ expressed in mm.

13. The one-dimension position measurement system according to claim 11, wherein said processing means are implemented for computing a precise position P of said camera with respect to said first ruler by combining the absolute position p and a precise position dx, said precise position dx being calculated from:

$$dx = M \cdot \gamma / 2\pi.$$
$$P = M \cdot p + dx.$$

and $$S = \sum_{i=1}^{l \cdot m} A_k(i) \cdot \sin\left(\frac{2\pi(i - 1/2)}{m}\right)$$

$$C = \sum_{i=1}^{l \cdot m} A_k(i) \cdot \cos\left(\frac{2\pi(i - 1/2)}{m}\right)$$

$$\gamma = -a\tan2(S, C)$$

where $A_k$ is the horizontal projection of said acquired picture, m is the period of $A_k$ expressed in number of pixels of said acquired picture, and M is the period of $A_k$ expressed in mm.

14. The one-dimension position measurement system of claim 1, wherein said code $s_i$ applied on said first ruler uses a Manchester encoding having horizontal transitions between a building block b and a building block w, in that said processing means are implemented for computing an absolute precise position P by combining the absolute position p and a precise position dx, said precise position dx being calculated from:

$$dx = M \cdot \gamma / 2\pi.$$
$$P = M \cdot p + dx.$$

and $$S = \sum_{j=0}^{l-1} W_j \sum_{i=1}^{m/2} A_k(i + j*m/2) \cdot \sin\left(\frac{2\pi(i + 1/2)}{m} + j \cdot \pi\right)$$

$$C = \sum_{j=0}^{l-1} W_j \sum_{i=1}^{m/2} A_k(i + j*m/2) \cdot \cos\left(\frac{2\pi(i + 1/2)}{m} + j \cdot \pi\right)$$

$$\gamma = -a\tan2(S, C)$$

with $$W_j = \begin{cases} T_j, & \text{if } j \text{ is even;} \\ -T_j, & \text{if } j \text{ is odd.} \end{cases}$$

and $$T_j = \begin{cases} 1 & \text{if there is a } bw \text{ transition between } p_j \text{ and } p_{j+1}; \\ -1 & \text{if there is a } wb \text{ transition between } p_j \text{ and } p_{j+1}; \\ 0 & \text{if there are no transitions between } p_j \text{ and } p_{j+1}. \end{cases}$$

where $A_k$ is the horizontal projection of said acquired picture, m is the period of $A_k$ expressed in number of pixels of said acquired picture, M is the period of $A_k$ expressed in mm, $p_j$ is the position of the $j^{th}$ building block in said acquired picture, a bw transition being a transition from a building block b to a building block w, and wherein said processing means are furthermore implemented for correcting the precise position dx by M/2 when the acquired picture does not contain a Manchester code,
the acquired picture contains a code with only "0".

15. The one-dimension position measurement system of claim 2, wherein said code $s_i$ applied on said first ruler uses a Manchester encoding having horizontal transitions between a building block b and a building block w, in that said processing means are implemented for computing an absolute precise position P by combining the absolute position p and a precise position dx, said precise position dx being calculated from:

$$dx = M \cdot \gamma / 2\pi.$$
$$P = M \cdot p + dx.$$

and $$S = \sum_{j=0}^{l-1} W_j \sum_{i=1}^{m/2} A_k(i + j*m/2) \cdot \sin\left(\frac{2\pi(i + 1/2)}{m} + j \cdot \pi\right)$$

$$C = \sum_{j=0}^{l-1} W_j \sum_{i=1}^{m/2} A_k(i + j*m/2) \cdot \cos\left(\frac{2\pi(i + 1/2)}{m} + j \cdot \pi\right)$$

$$\gamma = -a\tan2(S, C)$$

with $$W_j = \begin{cases} T_j, & \text{if } j \text{ is even;} \\ -T_j, & \text{if } j \text{ is odd.} \end{cases}$$

and

-continued $$T_j = \begin{cases} 1 & \text{if there is a } bw \text{ transition between } p_j \text{ and } p_{j+1}; \\ -1 & \text{if there is a } wb \text{ transition between } p_j \text{ and } p_{j+1}; \\ 0 & \text{if there are no transitions between } p_j \text{ and } p_{j+1}. \end{cases}$$

where $A_k$ is the horizontal projection of said acquired picture, m is the period of $A_k$ expressed in number of pixels of said acquired picture, M is the period of $A_k$ expressed in mm, $p_j$ is the position of the $j^{th}$ building block in said acquired picture, a bw transition being a transition from a building block b to a building block w, and wherein said processing means are furthermore implemented for correcting the precise position dx by M/2 when
   the acquired picture does not contain a Manchester code,
   the acquired picture contains a code with only "0".

16. The one-dimension position measurement system of claim 12, wherein the processing means are implemented for using the precise position dx to determine where the transitions between the bits of said code $s_i$ are in the acquired picture.

17. The one-dimension position measurement system of claim 13, wherein the processing means are implemented for using the precise position dx to determine where the transitions between the bits of said code $s_i$ are in the acquired picture.

18. The one-dimension position measurement system according to claim 1, furthermore comprising a second ruler, on which a second one-dimension binary code is applied, wherein said second ruler is disposed parallel to said first ruler, one end of said first ruler being tied to one end of said second ruler, the other end of said first and second rulers being free, wherein said camera is furthermore intended to acquire, on the same acquired picture, a portion of said second one-dimension binary code, wherein said first and second rulers are made of material having different temperature expansion coefficients.

19. The one-dimension position measurement system of claim 18, wherein, at a temperature T, said processing means are implemented for computing a position $x_{b0}$, $x_{b0}$ being the position of the portion of the first one-dimension code with respect to the camera when the position of the second one-dimension code with respect to the camera is null, and wherein said processing means are implemented for computing a temperature independent position x from the relation:

$$x = \frac{a_b x_a - a_a x_B}{a_b - a_a},$$

with $x_B = x_b - x_{b0}$ where $x_a$ is the measured position of the portion of said first one-dimension code with respect to the camera, $x_b$ is the measured position of the portion of said second one-dimension code with respect to the camera, $\alpha_a$ is the temperature expansion coefficient of said first ruler and $\alpha_b$ is the temperature expansion coefficient of said second ruler.

20. The one-dimension position measurement system of claim 18, wherein said processing means are implemented for:
   dividing horizontally the acquired picture depicting the portion of code of one of said first or second one-dimension position into a top half-pictures of height h and a bottom half-picture of height h,
   computing a precise position $p_t$ of the portion of code in top half-picture,
   computing a precise position $p_b$ of the portion of code in bottom half-picture, and
   computing the tilt angle θ between said camera and said first and second rulers from:

θ=arctan(Δx/h)

where $\Delta x = p_t - p_b$.

21. The one-dimension position measurement system of claim 19, wherein said processing means are implemented for:
   dividing horizontally the acquired picture depicting the portion of code of one of said first or second one-dimension position into a top half-pictures of height h and a bottom half-picture of height h,
   computing a precise position $p_t$ of the portion of code in top half-picture,
   computing a precise position $p_b$ of the portion of code in bottom half-picture, and
   computing the tilt angle θ between said camera and said first and second rulers from:

θ=arctan(Δx/h)

where $\Delta x = p_t - p_b$.

22. A one-dimension position measurement system comprising:
   a first ruler, on which is applied a first one-dimension code,
   a second ruler, on which is applied a second one-dimension code,
   a camera for acquiring simultaneously a picture of a portion of the first one-dimension code and of a portion of the second one-dimension code, and
   a processing means,
wherein said second ruler is disposed parallel to said first ruler, one end of said first ruler being tied to one end of said second ruler, the other end of said first and second rulers being free, and wherein said first and second rulers are made of material having different temperature expansion coefficients.

23. The one-dimension position measurement system of claim 22, wherein, at a temperature T, said processing means are implemented for computing a position $x_{b0}$, $x_{b0}$ being the position of the portion of the first one-dimension code with respect to the camera when the position of the second one-dimension code with respect to the camera is null, and wherein said processing means are implemented for computing a temperature independent position x from the relation:

$$x = \frac{a_b x_a - a_a x_B}{a_b - a_a},$$

with $x_B = x_b - x_{b0}$ where $x_a$ is the measured position of the portion of said first one-dimension code with respect to the camera, $x_b$ is the measured position of the portion of said second one-dimension code with respect to the camera, $\alpha_a$ is the temperature expansion coefficient of said first ruler and $\alpha_b$ is the temperature expansion coefficient of said second ruler.

24. The one-dimension position measurement system according to claim 22, wherein said processing means are implemented for
   dividing horizontally the acquired picture depicting the portion of code of one of said first or second one-dimension position into a top half-pictures of height h and a bottom half-picture of height h, computing a precise position $p_t$ of the portion of code in said top half-picture, computing a precise position $p_b$ of the portion of code in said bottom half-picture, and computing the tilt angle θ between said camera and said first and second rulers from:

$$\theta = \arctan(\Delta x/h)$$

where $\Delta x = p_t - p_b$.

* * * * *